(12) United States Patent
Xiao et al.

(10) Patent No.: US 11,669,008 B2
(45) Date of Patent: Jun. 6, 2023

(54) EXTREME ULTRAVIOLET MASK BLANK DEFECT REDUCTION METHODS

(71) Applicant: Applied Materials, Inc., Santa Clara, CA (US)

(72) Inventors: Wen Xiao, Singapore (SG); Sanjay Bhat, Singapore (SG); Shiyu Liu, Singapore (SG); Binni Varghese, Singapore (SG); Vibhu Jindal, San Jose, CA (US); Azeddine Zerrade, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 232 days.

(21) Appl. No.: 17/077,176

(22) Filed: Oct. 22, 2020

(65) Prior Publication Data

US 2021/0124252 A1    Apr. 29, 2021

Related U.S. Application Data

(60) Provisional application No. 62/925,880, filed on Oct. 25, 2019.

(51) Int. Cl.
| | |
|---|---|
| *G03F 1/22* | (2012.01) |
| *C23C 14/34* | (2006.01) |
| *H01J 37/34* | (2006.01) |
| *C23C 14/06* | (2006.01) |
| *H01J 37/32* | (2006.01) |
| *C23C 14/00* | (2006.01) |

(52) U.S. Cl.
CPC ............ *G03F 1/22* (2013.01); *C23C 14/0036* (2013.01); *C23C 14/0652* (2013.01); *C23C 14/0676* (2013.01); *C23C 14/3464* (2013.01); *H01J 37/32477* (2013.01); *H01J 37/3429* (2013.01)

(58) Field of Classification Search
CPC ...... G03F 1/22; G03F 1/24; G03F 1/52; H01J 37/3429; H01J 37/32477; G21K 2201/061; C23C 14/0652; C23C 14/0676; C23C 14/3464; C23C 14/0036; C23C 14/165; C23C 14/185; C23C 28/00; C23C 28/32; C23C 28/321; C23C 28/34; C23C 28/40; C23C 28/42
USPC .............. 403/5; 204/192.12, 192.15, 298.11
See application file for complete search history.

(56) References Cited

U.S. PATENT DOCUMENTS

| | | | |
|---|---|---|---|
| 4,410,407 A | 10/1983 | Macaulay | |
| 5,944,967 A | 8/1999 | Kunz et al. | |
| 6,277,507 B1 * | 8/2001 | Anzaki | C03C 17/3435 |
| | | | 428/428 |
| 6,396,900 B1 | 5/2002 | Barbee, Jr. et al. | |
| 9,580,796 B2 | 2/2017 | Ritchie et al. | |

(Continued)

FOREIGN PATENT DOCUMENTS

| | | |
|---|---|---|
| JP | 2018085332 A | 5/2018 |
| WO | WO2013152921 A1 | 10/2013 |
| WO | 2018156452 A1 | 8/2018 |

*Primary Examiner* — Jennifer Wecker
*Assistant Examiner* — Patrick S Ott
(74) *Attorney, Agent, or Firm* — Servilla Whitney LLC

(57) ABSTRACT

Methods for the manufacture of extreme ultraviolet (EUV) mask blanks and production systems therefor are disclosed. A method for forming an EUV mask blank comprises forming a bilayer on a portion of a multi-cathode PVD chamber interior and then forming a multilayer stack of Si/Mo on a substrate in the multi-cathode PVD chamber.

20 Claims, 5 Drawing Sheets

(56) References Cited

U.S. PATENT DOCUMENTS

| | | | |
|---|---|---|---|
| 9,773,665 B1* | 9/2017 | Zeng | C23C 14/0652 |
| 9,812,303 B2 | 11/2017 | Ritchie et al. | |
| 2010/0027107 A1 | 2/2010 | Yakshin et al. | |
| 2012/0009356 A1* | 1/2012 | Choi | C23C 16/4404 |
| | | | 118/723 MP |
| 2013/0209927 A1 | 8/2013 | Deweerd | |
| 2014/0345526 A1* | 11/2014 | Ranish | C23C 16/4411 |
| | | | 118/715 |
| 2017/0115555 A1* | 4/2017 | Hofmann | H01J 37/32715 |
| 2017/0131637 A1 | 5/2017 | Hofmann et al. | |
| 2017/0178877 A1* | 6/2017 | Subramani | C23C 14/3407 |
| 2018/0211826 A1* | 7/2018 | Wang | C23C 14/3407 |
| 2018/0291500 A1 | 10/2018 | Wang et al. | |
| 2019/0004420 A1 | 1/2019 | Ozawa et al. | |
| 2019/0088456 A1 | 3/2019 | Behara et al. | |
| 2019/0169737 A1* | 6/2019 | Maeda | C23C 14/3414 |
| 2019/0382879 A1 | 12/2019 | Jindal et al. | |

\* cited by examiner

EXTREME ULTRAVIOLET MASK BLANK DEFECT REDUCTION METHODS

CROSS-REFERENCE TO RELATED APPLICATIONS

This application claims priority to U.S. Provisional Application No. 62/925,880, filed Oct. 25, 2019, the entire disclosure of which is hereby incorporated by reference herein.

TECHNICAL FIELD

The present disclosure relates generally to extreme ultraviolet lithography, and more particularly to extreme ultraviolet mask blank manufacturing defect reduction methods and apparatus.

BACKGROUND

Extreme ultraviolet (EUV) lithography, also known as soft x-ray projection lithography, is used for the manufacture of 0.0135 micron and smaller minimum feature size semiconductor devices. Extreme ultraviolet light, which is generally in the 5 to 100 nanometer wavelength range, is strongly absorbed in virtually all materials. For that reason, extreme ultraviolet systems work by reflection rather than by transmission of light. Through the use of a series of mirrors, or lens elements, and a reflective element, or mask blank, coated with a non-reflective absorber mask pattern, the patterned actinic light is reflected onto a resist-coated semiconductor substrate.

The lens elements and mask blanks of extreme ultraviolet lithography systems are coated with reflective multilayer coatings of materials such as molybdenum and silicon. Reflection values of approximately 65% per lens element, or mask blank, have been obtained by using substrates that are coated with multilayer coatings that strongly reflect light within an extremely narrow ultraviolet bandpass, for example, 12.5 to 14.5 nanometer bandpass for 13.5 nanometer ultraviolet light.

EUV blanks have a low tolerance for defects on the working area of the blank. Silicon and molybdenum deposition leads to unbalanced stress on the chamber, which eventually contributes to stress related defects. The goal is to have zero killer type defects (large defects) in the working area of a blank, as these defects are difficult to repair and have a functioning EUV mask. Thus, there is a need for EUV blanks with reduced defects.

SUMMARY

One or more embodiments of the disclosure are directed to a method of manufacturing an extreme ultraviolet (EUV) mask blank, the method comprising depositing a first layer on a portion of a chamber interior of a multi-cathode physical vapor deposition (PVD) chamber; depositing a second layer on the first layer to form a bilayer selected from the group consisting of a $SiN_x/SiO_xN_y$ bilayer, a $SiN_x/Mo$ bilayer, a $SiN_x/Al$ bilayer, a $SiN_x/MoSi_x$ bilayer, a $SiN_x/AlSi_x$ bilayer, a $SiN_x/Mo_xAl_y$ bilayer, a $SiO_xN_y/Mo$ bilayer, a $SiO_xN_y/Al$ bilayer, a $SiO_xN_y/MoSi_x$ bilayer, a $SiO_xN_y/AlSi_x$ bilayer, and a $SiO_xN_y/Mo_xAl_y$ bilayer; placing a substrate in the multi-cathode physical vapor deposition (PVD) chamber; and forming a multilayer stack of alternating layers of molybdenum and silicon on the substrate.

Additional embodiments of the disclosure are related to a method of manufacturing an extreme ultraviolet (EUV) mask blank, the method comprising rotating a liner of a multi-cathode physical vapor deposition (PVD) chamber; depositing a first layer on the liner while the liner is rotating; depositing a second layer on the first layer while the liner is rotating to form a bilayer selected from the group consisting of a $SiN_x/SiO_xN_y$ bilayer, a $SiN_x/Mo$ bilayer, a $SiN_x/Al$ bilayer, a $SiN_x/MoSi_x$ bilayer, a $SiN_x/AlSi_x$ bilayer, a $SiN_x/Mo_xAl_y$ bilayer, a $SiO_xN_y/Mo$ bilayer, a $SiO_xN_y/Al$ bilayer, a $SiO_xN_y/MoSi_x$ bilayer, a $SiO_xN_y/AlSi_x$ bilayer, and a $SiO_xN_y/Mo_xAl_y$ bilayer; stopping rotation of the liner; placing a substrate in the multi-cathode physical vapor deposition (PVD) chamber including a chamber interior; and forming a multilayer stack of alternating layers of molybdenum and silicon on the substrate.

Further embodiments of the disclosure are directed to a multi-cathode physical vapor deposition (PVD) chamber comprising a first silicon target, a second silicon target, a third silicon target and a molybdenum target; a liner lining an interior of the PVD chamber, the liner configured to rotate; and a controller configured to control rotation of the liner during deposition of a first layer on the liner when the first silicon target is sputtered and during deposition of a second layer on the first layer to form a bilayer selected from the group consisting of a $SiN_x/SiO_xN_y$ bilayer, a $SiN_x/Mo$ bilayer, a $SiN_x/Al$ bilayer, a $SiN_x/MoSi_x$ bilayer, a $SiN_x/AlSi_x$ bilayer, a $SiN_x/Mo_xAl_y$ bilayer, a $SiO_xN_y/Mo$ bilayer, a $SiO_xN_y/Al$ bilayer, a $SiO_xN_y/MoSi_x$ bilayer, a $SiO_xN_y/AlSi_x$ bilayer, and a $SiO_xN_y/Mo_xAl_y$ bilayer when the second silicon target is sputtered.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

The term "horizontal" as used herein is defined as a plane parallel to the plane or surface of a mask blank, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" indicates that there is direct contact between elements. The term "directly on" indicates that there is direct contact between elements with no intervening elements.

As used in this specification and the appended claims, the terms "precursor", "reactant", "reactive gas" and the like are used interchangeably to refer to any gaseous species that reacts with the substrate surface.

Those skilled in the art will understand that the use of ordinals such as "first" and "second" to describe process regions do not imply a specific location within the processing chamber, or order of exposure within the processing chamber.

As used in this specification and the appended claims, the term "substrate" refers to a surface, or portion of a surface, upon which a process acts. It will also be understood by those skilled in the art that reference to a substrate is to only a portion of the substrate, unless the context clearly indicates otherwise. Additionally, in some embodiments, reference to depositing on a substrate means both a bare substrate and a substrate with one or more films or features deposited or formed thereon.

Figure 1:
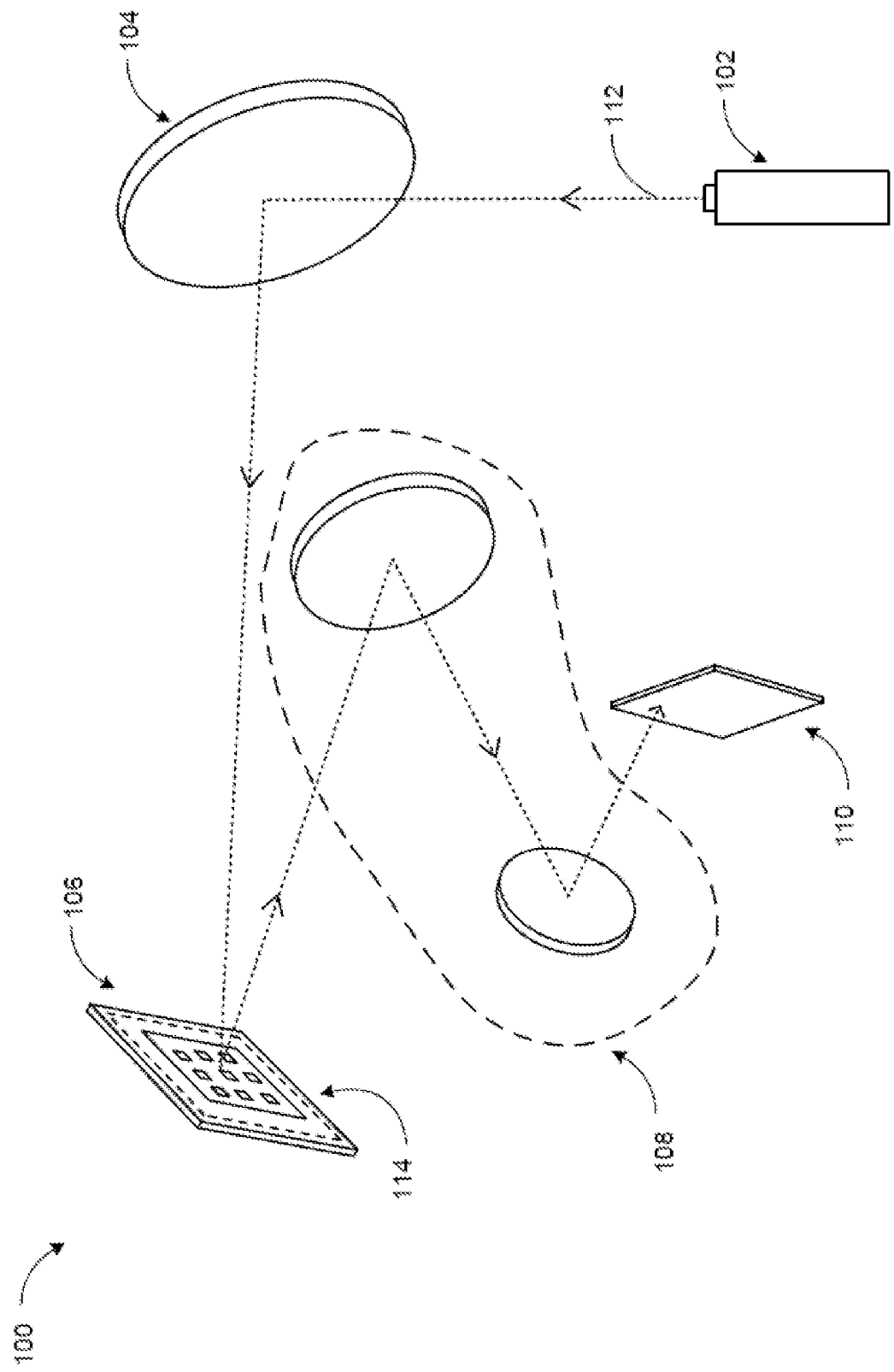
FIG. 1 schematically illustrates an embodiment of an extreme ultraviolet lithography system.

Referring now to FIG. 1, an exemplary embodiment of an extreme ultraviolet lithography system 100 is shown. The extreme ultraviolet lithography system 100 includes an extreme ultraviolet light source 102 for producing extreme ultraviolet light 112, a set of reflective elements, and a target wafer 110. The reflective elements include a condenser 104, an EUV reflective mask 106, an optical reduction assembly 108, a mask blank, a mirror, or a combination thereof.

The extreme ultraviolet light source 102 generates the extreme ultraviolet light 112. The extreme ultraviolet light 112 is electromagnetic radiation having a wavelength in a range of 5 to 50 nanometers (nm). For example, the extreme ultraviolet light source 102 includes a laser, a laser produced plasma, a discharge produced plasma, a free-electron laser, synchrotron radiation, or a combination thereof.

The extreme ultraviolet light source 102 generates the extreme ultraviolet light 112 having a variety of characteristics. The extreme ultraviolet light source 102 produces broadband extreme ultraviolet radiation over a range of wavelengths. For example, the extreme ultraviolet light source 102 generates the extreme ultraviolet light 112 having wavelengths ranging from 5 to 50 nm.

In one or more embodiments, the extreme ultraviolet light source 102 produces the extreme ultraviolet light 112 having a narrow bandwidth. For example, the extreme ultraviolet light source 102 generates the extreme ultraviolet light 112 at 13.5 nm. The center of the wavelength peak is 13.5 nm.

The condenser 104 is an optical unit for reflecting and focusing the extreme ultraviolet light 112. The condenser 104 reflects and concentrates the extreme ultraviolet light 112 from the extreme ultraviolet light source 102 to illuminate the EUV reflective mask 106.

Although the condenser 104 is shown as a single element, it is understood that the condenser 104 of some embodiments includes one or more reflective elements such as concave mirrors, convex mirrors, flat mirrors, or a combination thereof, for reflecting and concentrating the extreme ultraviolet light 112. For example, the condenser 104 of some embodiments is a single concave mirror or an optical assembly having convex, concave, and flat optical elements.

The EUV reflective mask 106 is an extreme ultraviolet reflective element having a mask pattern 114. The EUV reflective mask 106 creates a lithographic pattern to form a circuitry layout to be formed on the target wafer 110. The EUV reflective mask 106 reflects the extreme ultraviolet light 112. The mask pattern 114 defines a portion of a circuitry layout.

The optical reduction assembly 108 is an optical unit for reducing the image of the mask pattern 114. The reflection of the extreme ultraviolet light 112 from the EUV reflective mask 106 is reduced by the optical reduction assembly 108 and reflected on to the target wafer 110. The optical reduction assembly 108 of some embodiments includes mirrors and other optical elements to reduce the size of the image of the mask pattern 114. For example, the optical reduction assembly 108 of some embodiments includes concave mirrors for reflecting and focusing the extreme ultraviolet light 112.

The optical reduction assembly 108 reduces the size of the image of the mask pattern 114 on the target wafer 110. For example, the mask pattern 114 of some embodiments is imaged at a 4:1 ratio by the optical reduction assembly 108 on the target wafer 110 to form the circuitry represented by the mask pattern 114 on the target wafer 110. The extreme ultraviolet light 112 of some embodiments scans the reflective mask 106 synchronously with the target wafer 110 to form the mask pattern 114 on the target wafer 110.

Figure 2:
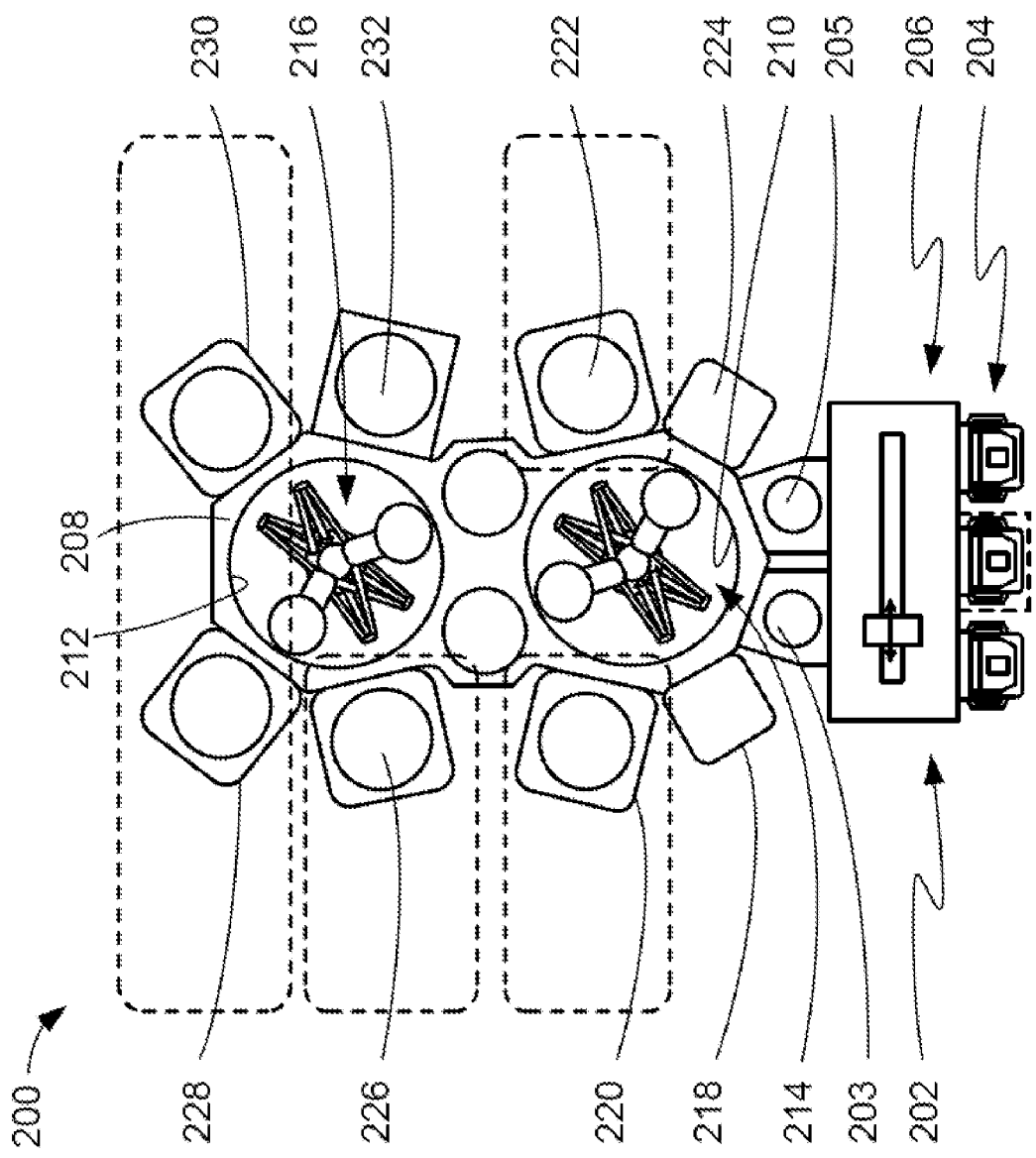
FIG. 2 illustrates an embodiment of an extreme ultraviolet reflective element production system.

Referring now to FIG. 2, an embodiment of an extreme ultraviolet reflective element production system 200 is shown. The extreme ultraviolet reflective element includes a EUV mask blank 204, an extreme ultraviolet (EUV) mirror 205, or other reflective element such as an EUV reflective mask 106.

The extreme ultraviolet reflective element production system 200 of some embodiments produces mask blanks, mirrors, or other elements that reflect the extreme ultraviolet light 112 of FIG. 1. The extreme ultraviolet reflective element production system 200 fabricates the reflective elements by applying thin coatings to source substrates 203.

The EUV mask blank 204 is a multilayered structure for forming the EUV reflective mask 106 of FIG. 1. The EUV mask blank 204 of some embodiments is formed using semiconductor fabrication techniques. The EUV reflective mask 106 of some embodiments has the mask pattern 114 of FIG. 1 formed on the mask blank 204 by etching and other processes.

The extreme ultraviolet mirror 205 is a multilayered structure reflective in a range of extreme ultraviolet light. The extreme ultraviolet mirror 205 of some embodiments is formed using semiconductor fabrication techniques. The EUV mask blank 204 and the extreme ultraviolet mirror 205 of some embodiments are similar structures with respect to the layers formed on each element, however, the extreme ultraviolet mirror 205 does not have the mask pattern 114.

The reflective elements are efficient reflectors of the extreme ultraviolet light 112. In an embodiment, the EUV mask blank 204 and the extreme ultraviolet mirror 205 has an extreme ultraviolet reflectivity of greater than 60%. The reflective elements are efficient if they reflect more than 60% of the extreme ultraviolet light 112.

The extreme ultraviolet reflective element production system 200 includes a wafer loading and carrier handling system 202 into which the source substrates 203 are loaded and from which the reflective elements are unloaded. An atmospheric handling system 206 provides access to a wafer handling vacuum chamber 208. The wafer loading and carrier handling system 202 of some embodiments includes substrate transport boxes, loadlocks, and other components to transfer a substrate from atmosphere to vacuum inside the system. Because the EUV mask blank 204 is used to form devices at a very small scale, the source substrates 203 and the EUV mask blank 204 are processed in a vacuum system to prevent contamination and other defects.

The wafer handling vacuum chamber 208 of some embodiments contains two vacuum chambers, a first vacuum chamber 210 and a second vacuum chamber 212. The first vacuum chamber 210 includes a first wafer handling system 214 and the second vacuum chamber 212 includes a second wafer handling system 216. Although the wafer handling vacuum chamber 208 is described with two vacuum chambers, it is understood that the system of some embodiments has any number of vacuum chambers.

The wafer handling vacuum chamber 208 of some embodiments has a plurality of ports around its periphery for attachment of various other systems. The first vacuum chamber 210 has a degas system 218, a first physical vapor deposition system 220, a second physical vapor deposition system 222, and a pre-clean system 224. The degas system 218 is for thermally desorbing moisture from the substrates. The pre-clean system 224 is for cleaning the surfaces of the wafers, mask blanks, mirrors, or other optical components.

The physical vapor deposition systems, such as the first physical vapor deposition system 220 and the second physical vapor deposition system 222, of some embodiments are used to form thin films of conductive materials on the source substrates 203. For example, the physical vapor deposition systems of some embodiments include vacuum deposition system such as magnetron sputtering systems, ion sputtering systems, pulsed laser deposition, cathode arc deposition, or a combination thereof. The physical vapor deposition systems, such as the magnetron sputtering system, form thin layers on the source substrates 203 including the layers of silicon, metals, alloys, compounds, or a combination thereof.

The physical vapor deposition system forms reflective layers, capping layers, and absorber layers. For example, the physical vapor deposition systems of some embodiments form layers of silicon, molybdenum, titanium oxide, titanium dioxide, ruthenium oxide, niobium oxide, ruthenium tungsten, ruthenium molybdenum, ruthenium niobium, chromium, tantalum, nitrides, compounds, or a combination thereof. Although some compounds are described as an oxide, it is understood that the compounds of some embodiments include oxides, dioxides, atomic mixtures having oxygen atoms, or a combination thereof.

The second vacuum chamber 212 has a first multi-cathode source 226, a chemical vapor deposition system 228, a cure chamber 230, and an ultra-smooth deposition chamber 232 connected to it. For example, the chemical vapor deposition system 228 of some embodiments includes a flowable chemical vapor deposition system (FCVD), a plasma assisted chemical vapor deposition system (CVD), an aerosol assisted CVD, a hot filament CVD system, or a similar system. In another example, the chemical vapor deposition system 228, the cure chamber 230, and the ultra-smooth deposition chamber 232 of some embodiments are in a separate system from the extreme ultraviolet reflective element production system 200.

The chemical vapor deposition system 228 of some embodiments forms thin films of material on the source substrates 203. For example, the chemical vapor deposition system 228 of some embodiments is used to form layers of materials on the source substrates 203 including monocrystalline layers, polycrystalline layers, amorphous layers, epitaxial layers, or a combination thereof. The chemical vapor deposition system 228 of some embodiments forms layers of silicon, silicon oxides, silicon oxycarbide, carbon, tungsten, silicon carbide, silicon nitride, titanium nitride, metals, alloys, and other materials suitable for chemical vapor deposition. For example, the chemical vapor deposition system of some embodiments forms planarization layers.

The first wafer handling system 214 is capable of moving the source substrates 203 between the atmospheric handling system 206 and the various systems around the periphery of the first vacuum chamber 210 in a continuous vacuum. The second wafer handling system 216 is capable of moving the source substrates 203 around the second vacuum chamber 212 while maintaining the source substrates 203 in a continuous vacuum. The extreme ultraviolet reflective element production system 200 of some embodiments transfers the source substrates 203 and the EUV mask blank 204 between the first wafer handling system 214, the second wafer handling system 216 in a continuous vacuum.

In the following sections, the term for the EUV mask blank 204 is used interchangeably with the term of the extreme ultraviolet mirror 205 for simplicity. The EUV mask blank 204 is an optically flat structure used for forming the reflective mask 106 having the mask pattern 114. In one or more embodiments, the reflective surface of the EUV mask blank 204 forms a flat focal plane for reflecting the incident light, such as the extreme ultraviolet light 112 of FIG. 1.

Figure 3:
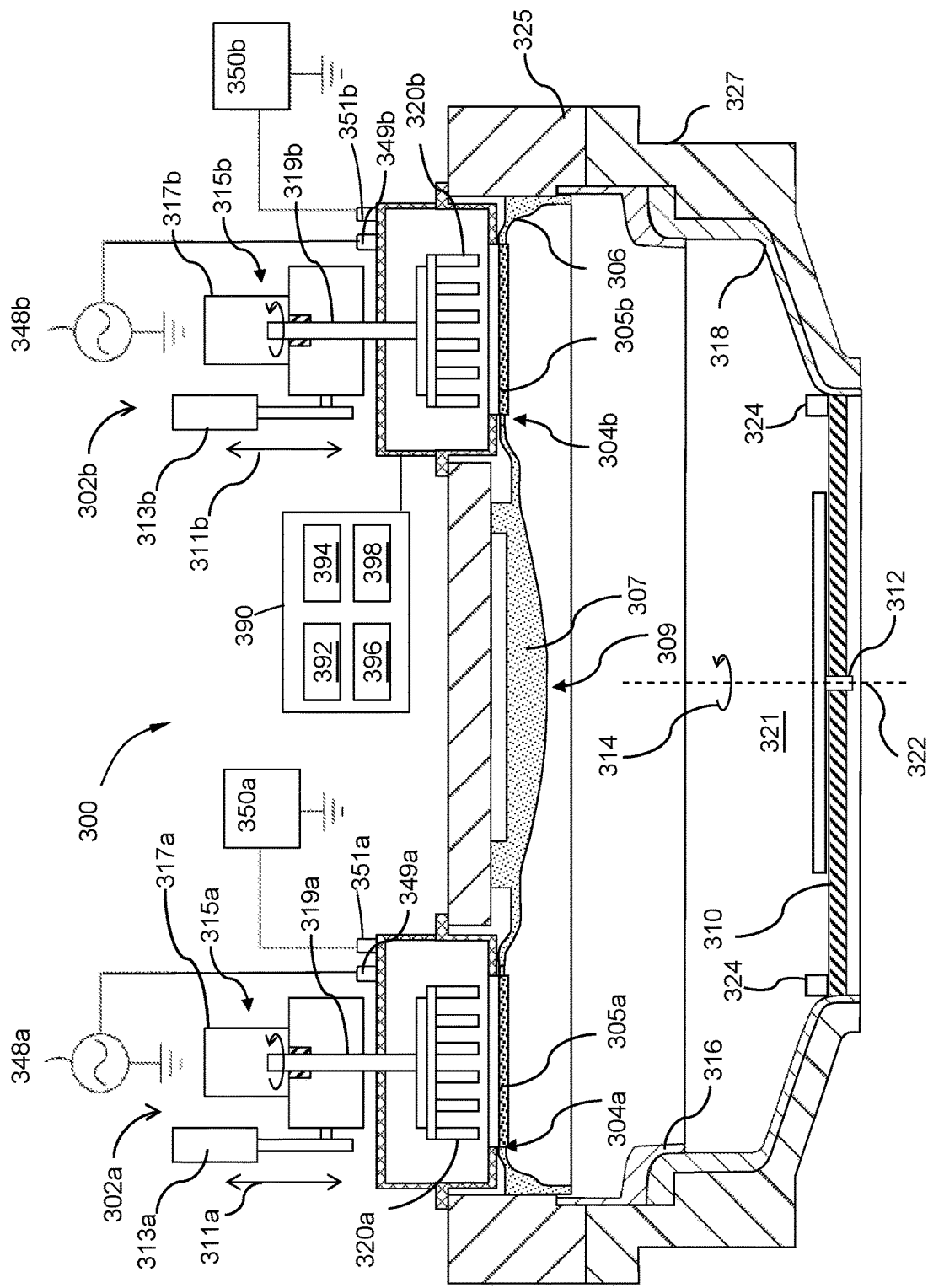
FIG. 3 is a side view of a multi-cathode PVD chamber according to one or more embodiments.

Referring now to FIG. 3, which depicts embodiment of a PVD chamber 300, which includes a plurality of cathode assemblies 302a and 302b. While only two cathode assemblies 302a and 302b are shown in the side view of FIG. 3, a multi-cathode chamber can comprise more than two cathode assemblies, for example, five, six or more than six cathode assemblies. An upper shield 306 is provided below the plurality of cathode assemblies 302a and 302b, the upper shield 306 having two shield holes 304a and 304b to expose targets 305a, 305b disposed at the bottom of the cathode assemblies 302a and 302b to the interior space 321 of the PVD chamber 300. The PVD chamber 300 comprising multiple cathode assemblies is also referred to as a multi-cathode PVD chamber.

The PVD chamber 300 in FIG. 3 comprises a modular chamber body, in which an intermediate chamber body 325 is located above and adjacent a lower chamber body 327. The intermediate chamber body 325 is secured to the lower chamber body 327 to form the modular chamber body, which surrounds lower shield 318 and the middle shield 316. A top adapter lid (not shown) is disposed above intermediate chamber body 325 to surround upper shield 306.

PVD chamber 300 is also provided with a rotating pedestal 310. It will be appreciated that the upper shield 306 of the PVD chamber 300 of FIG. 3 is substantially flat. However, the upper shield 306 according to some embodiments can be dome-shaped or conically-shaped.

The upper shield 306 includes a raised area 309 in the region 307 between the first shield hole and the second shield hole. The PVD chamber 300 is configured to alternately sputter material from the first target 305a and the second target 305b without rotating the upper shield 306.

In one or more embodiments, the raised area 309 has a height H so that during a sputtering process, the raised area height H is sufficient to prevents material sputtered from the first target 305a from being deposited on the second target 305b and to prevent material sputtered from the second target 305b from being deposited on the first target 305a.

According to one or more embodiments of the disclosure, the first cathode assembly 302a comprises a first magnet spaced apart from the first backing plate, and the second cathode assembly 302b comprises a second magnet 320b, wherein the first magnet 320a and the second magnet 320b are movable as indicated by arrows 311a and 311b by a linear actuator 313a and a linear actuator 313b. The linear actuator 313a and the linear actuator 313b can comprise any suitable device that can respectively effect linear motion of first magnet assembly 315a and second magnet assembly 315b. First magnet assembly 315a includes rotational motor 317a, which can comprise a servo motor to rotate the first magnet 320a via shaft 319a coupled to rotational motor 317a. Second magnet assembly 315b includes rotational motor 317b, which can comprise a servo motor to rotate the second magnet 320b via shaft 319b coupled to rotational motor 317b. It will be appreciated that the first magnet assembly 315a may include a plurality of magnets in addition to the first magnet 320a. Similarly, the second magnet assembly 315b may include a plurality of magnets in addition to the second magnet 320b.

In some embodiments, the first target 305a comprises a molybdenum target and the second target 305b comprises a silicon target, and the PVD chamber 300 further comprises a third cathode assembly (not shown) including a third backing plate to support a third target (not shown) and a fourth cathode assembly (not shown) including a fourth backing plate configured to support a fourth target (not shown). The third cathode assembly and fourth cathode assembly according to one or more embodiments are configured in the same manner as the first and second cathode assemblies 302a, 3202b as described herein. In a specific embodiment, a target comprises silicon, a second target comprises silicon, a third target comprises silicon, and a fourth target comprises molybdenum. The first target in some embodiments is sputtered to form $SiN_x$, and the second target is sputtered to form $SiO_xN_y$, a metal layer, or an alloy layer. In some embodiments, the first target is sputtered to form $SiO_xN_y$, and the second target is sputtered to form a metal layer or an alloy layer. In one or more embodiments, exemplary metals include Mo, and Al and exemplary alloys include $MoSi_x$, $AlSi_x$, $Mo_xAl_y$. Thus, in some embodiments, the first target and the second targets are sputtered to form $SiN_x$/Mo bilayers, $SiN_x$/Al bilayers, $SiN_x$/MoSi$_x$ bilayers, $SiN_x$/AlSi$_x$ bilayers, $SiN_x$/Mo$_x$Al$_y$ bilayers, $SiO_xN_y$/Mo bilayers, $SiO_xN_y$/Al bilayers, $SiO_xN_y$/MoSi$_x$ bilayers, $SiO_xN_y$/AlSi$_x$ bilayers, and $SiO_xN_y$/Mo$_x$Al$_y$ bilayers. In one or more embodiments, the third target and the fourth target are sputtered to form a multilayer stack of Mo/Si.

Plasma sputtering may be accomplished using either DC sputtering or RF sputtering in the PVD chamber 300. In some embodiments, the process chamber includes a feed structure for coupling RF and DC energy to the targets associated with each cathode assembly. For cathode assembly 302a, a first end of the feed structure can be coupled to an RF power source 348a and a DC power source 350a, which can be respectively utilized to provide RF and DC energy to the target 305a. The RF power source 348a is coupled to RF power in 349a and the DC power source 350a is coupled to DC power in 351a. For example, the DC power source 350a may be utilized to apply a negative voltage, or bias, to the target 305a. In some embodiments, RF energy supplied by the RF power source 348a may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

Likewise, for cathode assembly 302b, a first end of the feed structure can be coupled to an RF power source 348b and a DC power source 350b, which can be respectively utilized to provide RF and DC energy to the target 305b. The RF power source 348b is coupled to RF power in 349b and the DC power source 350b is coupled to DC power in 351b. For example, the DC power source 350b may be utilized to apply a negative voltage, or bias, to the target 305b. In some embodiments, RF energy supplied by the RF power source 348b may range in frequency from about 2 MHz to about 60 MHz, or, for example, non-limiting frequencies such as 2 MHz, 13.56 MHz, 27.12 MHz, 40.68 MHz or 60 MHz can be used. In some embodiments, a plurality of RF power sources may be provided (i.e., two or more) to provide RF energy in a plurality of the above frequencies.

While the embodiment shown includes separate RF power sources 348a and 348b for cathode assemblies 302a and 302b, and separate DC power sources 350a and 350b for cathode assemblies 302a and 302b, the PVD chamber can comprise a single RF power source and a single DC power source with feeds to each of the cathode assemblies.

The PVD chamber 300 shown in FIG. 3 includes removable PVD chamber interior components that are exposed to contamination during PVD processes. These removable PVD chamber interior components may collectively be referred to as a "process kit." In FIG. 3, the process kit includes the upper shield 306, the middle shield 316, and the lower shield 318. In some embodiments, a single shield or a plurality of shields, such as the upper shield 306, the middle shield 316 and the lower shield 318 comprise a liner that lines the interior of the PVD chamber 300. The liner in some embodiments comprises an Al/O surface. The process kit according to some embodiments may further comprise components listed, as well as other components such as a bottom liner, deposition rings, a cover ring and a target backing plate shield.

In some embodiments, the PVD chamber 300 is equipped with a controller 390. There may be a single controller or multiple controllers. When there is more than one controller, each of the controllers is in communication with each of the other controllers to control of the overall functions of the PVD chamber 300. For example, when multiple controllers are utilized, a primary control processor is coupled to and in communication with each of the other controllers to control the system. The controller is one of any form of general-purpose computer processor, microcontroller, microprocessor, etc., that can be used in an industrial setting for controlling various chambers and sub-processors. As used herein, "in communication" means that the controller can send and receive signals via a hard-wired communication line or wirelessly.

Each controller can comprise processor 392, a memory 394 coupled to the processor, input/output devices coupled to the processor 392, and support circuits 396 and 398 to provide communication between the different electronic components. The memory includes one or more of transitory memory (e.g., random access memory) and non-transitory memory (e.g., storage) and the memory of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor that is remotely located from the hardware being controlled by the processor. In one or more embodiments, some or all of the methods of the present disclosure are controlled hardware. As such, in some embodiments, the processes are implemented by software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, a multi-cathode physical vapor deposition (PVD) chamber 300 comprises a first silicon target, a second silicon target, a third silicon target and a molybdenum target and a liner lining the interior of the PVD chamber, the liner configured to rotate as described below. The liner can be comprised of one of more shields as described above. The PVD chamber 300 further comprises a controller configured to control rotation of the liner during deposition of a $SiN_x$ layer on the liner when the first silicon target is sputtered and during deposition of a $SiO_xN_y$ layer on the $SiN_x$ layer to form a $SiN_x/SiO_xN_y$ bilayer when the second silicon target is sputtered. In some embodiments, the controller is configured to form 3 to 8 a $SiN_x/SiO_xN_y$ bilayers.

In some embodiments, the controller is configured to control rotation of the liner during deposition when the first target is sputtered to form $SiN_x$, and the second target is sputtered to form $SiO_xN_y$, a metal layer from a metal target, or an alloy layer. In some embodiments, the first target is sputtered to form $SiO_xN_y$, and the second target is sputtered to form a metal layer from a metal target or an alloy layer. In one or more embodiments, exemplary metals include Mo, and Al and exemplary alloys include $MoSi_x$, $AlSi_x$, $Mo_xAl_y$. Thus, in some embodiments, the controller is configured to configured to control rotation of the liner during deposition when the first target and the second targets are sputtered to form $SiN_x/Mo$ bilayers, $SiN_x/Al$ bilayers, $SiN_x/MoSi_x$ bilayers, $SiN_x/AlSi_x$ bilayers, $SiN_x/Mo_xAl_y$ bilayers, $SiO_xN_y/Mo$ bilayers, $SiO_xN_y/Al$ bilayers, $SiO_xN_y/MoSi_x$ bilayers, $SiO_xN_y/AlSi_x$ bilayers, and $SiO_xN_y/Mo_xAl_y$ bilayers. In some embodiments, the controller is configured to stop rotation of the liner prior to loading of a substrate into the chamber. In some embodiments the controller is configured to control the chamber to form a multilayer stack of alternating layers of molybdenum and silicon on the substrate by alternately sputtering the third silicon target and the fourth molybdenum target.

Figure 4:
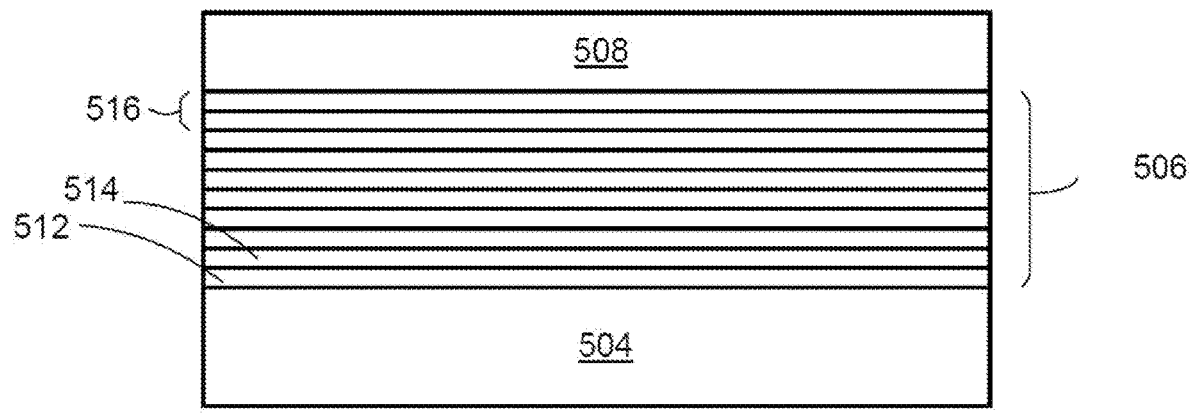
FIG. 4 illustrates an embodiment of an extreme ultraviolet reflective element such as an EUV mask blank.

Referring now to FIG. 4, an embodiment of an extreme ultraviolet reflective element 502 is shown. In one or more embodiments, the extreme ultraviolet reflective element 502 is the EUV mask blank 204 of FIG. 2 or the extreme ultraviolet mirror 205 of FIG. 2. The EUV mask blank 204 and the extreme ultraviolet mirror 205 are structures for reflecting the extreme ultraviolet light 112 of FIG. 1. The EUV mask blank 204 is used to form the EUV reflective mask 106 shown in FIG. 1.

The extreme ultraviolet reflective element 502 includes a substrate 504, a reflective multilayer stack 506 of reflective layers, and a capping layer 508. The reflective multilayer stack 506 reflects EUV radiation, for example at a wavelength of 13.5 nm. In one or more embodiments, the extreme ultraviolet mirror 205 is used to form reflecting structures for use in the condenser 104 of FIG. 1 or the optical reduction assembly 108 of FIG. 1.

The extreme ultraviolet reflective element 502, which in some embodiments is an EUV mask blank 204, includes the substrate 504, the reflective multilayer stack 506 of reflective layers comprising alternating layers of silicon and molybdenum, and an optional capping layer 508. The extreme ultraviolet reflective element 502 in some embodiments is a EUV mask blank 204, which is used to form the reflective mask 106 of FIG. 1 by patterning. In the following sections, the term for the EUV mask blank 204 is used interchangeably with the term of the extreme ultraviolet mirror 205 for simplicity.

The EUV mask blank 204 is an optically flat structure used for forming the reflective mask 106 having the mask pattern 114. In one or more embodiments, the reflective surface of the EUV mask blank 204 forms a flat focal plane for reflecting the incident light, such as the extreme ultraviolet light 112 of FIG. 1.

The substrate 504 is an element for providing structural support to the extreme ultraviolet reflective element 502. In one or more embodiments, the substrate 504 is made from a material having a low coefficient of thermal expansion (CTE) to provide stability during temperature changes. In one or more embodiments, the substrate 504 has properties such as stability against mechanical cycling, thermal cycling, crystal formation, or a combination thereof. The substrate 504 according to one or more embodiments is formed from a material such as silicon, glass, oxides, ceramics, glass ceramics, or a combination thereof.

The reflective multilayer stack 506 is a structure that is reflective to the extreme ultraviolet light 112. The reflective multilayer stack 506 includes alternating reflective layers of a first reflective layer 512 and a second reflective layer 514. The first reflective layer 512 and the second reflective layer 514 form a reflective pair 516 of FIG. 4. In a non-limiting embodiment, the multilayer stack 506 includes a range of 20-60 of the reflective pairs 516 for a total of up to 120 reflective layers.

The first reflective layer 512 and the second reflective layer 514 according to one or more embodiments are formed from a variety of materials. In an embodiment, the first reflective layer 512 and the second reflective layer 514 are formed from silicon and molybdenum, respectively. The first reflective layer 512 and the second reflective layer 514 of some embodiments have a variety of structures. In an embodiment, both the first reflective layer 512 and the second reflective layer 514 are formed with a single layer, multiple layers, a divided layer structure, non-uniform structures, or a combination thereof. Because most materials absorb light at extreme ultraviolet wavelengths, the optical elements used are reflective instead of the transmissive, as used in other lithography systems. The reflective multilayer stack 506 forms a reflective structure by having alternating thin layers of materials with different optical properties to create a Bragg reflector or mirror.

In an embodiment, each of the alternating layers has dissimilar optical constants for the extreme ultraviolet light 112. The alternating layers provide a resonant reflectivity when the period of the thickness of the alternating layers is one half the wavelength of the extreme ultraviolet light 112. In an embodiment, for the extreme ultraviolet light 112 at a wavelength of 13.5 nm, the alternating layers are about 6.5 nm thick. It is understood that the sizes and dimensions provided are within normal engineering tolerances for typical elements.

The reflective multilayer stack 506 according to one or more embodiments is formed in a variety of ways. In an embodiment, the first reflective layer 512 and the second reflective layer 514 are formed with magnetron sputtering, ion sputtering systems, pulsed laser deposition, cathode arc deposition, or a combination thereof.

In an illustrative embodiment, the reflective multilayer stack 506 is formed using a physical vapor deposition technique, such as magnetron sputtering. In an embodiment, the first reflective layer 512 and the second reflective layer 514 of the reflective multilayer stack 506 have the characteristics of being formed by the magnetron sputtering technique including precise thickness, low roughness, and clean interfaces between the layers. In an embodiment, the first reflective layer 512 and the second reflective layer 514 of the reflective multilayer stack 506 have the characteristics of being formed by the physical vapor deposition including precise thickness, low roughness, and clean interfaces between the layers.

The physical dimensions of the layers of the reflective multilayer stack 506 formed using the physical vapor deposition technique is precisely controlled to increase reflectivity. In an embodiment, the first reflective layer 512, such as a layer of silicon, has a thickness of 4.1 nm. The second reflective layer 514, such as a layer of molybdenum, has a thickness of 2.8 nm. The thickness of the layers dictates the peak reflectivity wavelength of the extreme ultraviolet reflective element. If the thickness of the layers is incorrect, the reflectivity at the desired wavelength 13.5 nm of some embodiments reduced.

In one or more embodiments, the capping layer 508 is a protective layer allowing the transmission of the extreme ultraviolet light 112. In an embodiment, the capping layer 508 is formed directly on the reflective multilayer stack 506. In one or more embodiments, the capping layer 508 protects the reflective multilayer stack 506 from contaminants and mechanical damage. In one embodiment, the reflective multilayer stack 506 is sensitive to contamination by oxygen, carbon, hydrocarbons, or a combination thereof. The capping layer 508 according to an embodiment interacts with the contaminants to neutralize them.

Typically, in a multi-cathode (MC) chamber, the target is exposed to the MC chamber through a rotating shield. The shield first moves to a silicon target for deposition, followed by rotating to a molybdenum target. This means that the rotating shield will be exposed to molybdenum or silicon target depositions from the same opening (or hole) in the rotating shield, therefore, providing relatively uniform deposition on the rotating shield compared to the rest of the process kit. The lower process kit (i.e., extension shield, conical shield, cover ring, deposition ring and puck), however, will see non-symmetric deposition. There will be regions, therefore, of the lower process kit that will see pure silicon deposition (silicon-rich areas) and some portions that will see pure molybdenum deposition.

It was discovered that one of the major sources of defects generated during the deposition process during the formation of EUV mask blanks are Si-rich flakes that are flaked off from the process kits in a PVD chamber due to their poor adhesion to surfaces of the interior of the chamber, which are comprised of Al/O. A process called "pasting" utilizes deposition of molybdenum to paste down the deposited silicon (i.e. the molybdenum is depositing on top of the silicon and holding the silicon in place), thus preventing the silicon from flaking. It was determined however, that while Mo pasting the process kit after each Si deposition can reduce the accumulation of thick Si layers on the process kits, molybdenum pasting could not completely eliminate defects because of the much smaller plasma plume profile of Mo as compared with that of Si prevent Mo from pasting all of the Si deposited areas of the process kit.

In one or more embodiments of the disclosure, methods are provided which comprise applying an adhesive buffer material to the PVD chamber interior 450, for example, process kits comprising Al/O surfaces before depositing a Mo/Si multilayer stack 506 during the manufacture of an EUV reflective element 502 such as an EUV mask blank. A characteristic of the adhesive buffer material in some embodiments is that the adhesive buffer material exhibit sufficient adhesion to both Al/O and Mo/Si to prevent flaking off of particles and generation of defects.

Embodiments of the disclosure pertain to forming a layered adhesive coating comprising one or more of silicon oxynitride ($SiO_xN_y$), for example, $Si_2N_2O$, and silicon nitride ($SiN_x$), for example, $Si_3N_4$, multilayers on at least a portion of interior components of a PVD chamber, for example, process kit components such as a liner. In some embodiments, the liner comprises at least one of the upper shield 306, the middle shield 316, and the lower shield 318 as shown in FIG. 3, as well as other components such as a bottom liner, deposition rings, a cover ring and a target backing plate shield. In some embodiments, alternating layers of silicon oxynitride ($SiO_xN_y$) and silicon nitride ($SiN_x$) are formed on interior components of a PVD chamber such as one or more process kit components.

Figure 5:
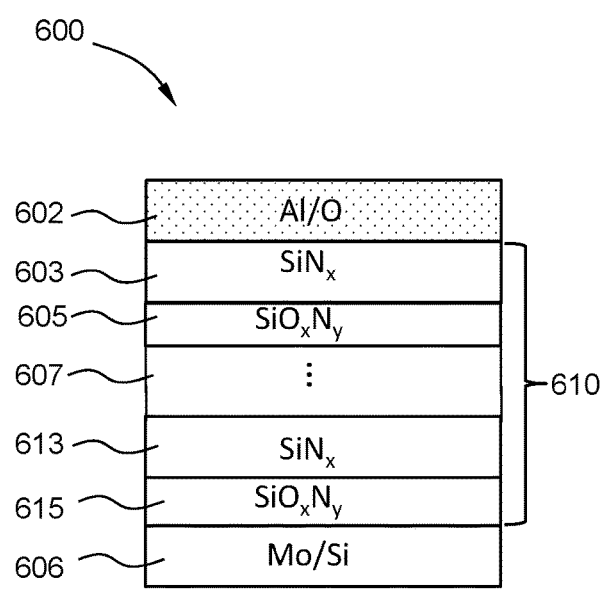
FIG. 5 illustrates an embodiment of a $SiN_x/SiO_xN_y$ bilayer coating on an Al/O surface of a PVD chamber according to an embodiment.

According to a specific embodiment of the disclosure, with reference to FIG. 5, an interior component 602 of a PVD chamber such as a liner is shown as comprising an Al/O surface. The interior component 602 of the PVD chamber according to an embodiment includes one or more process kit components such as the upper shield 306, the middle shield 316, and the lower shield 318 as shown in FIG. 3, as well as other components such as a bottom liner, deposition rings, a cover ring and a target backing plate shield. A $SiN_x$ layer 603 is deposited on the interior component 602 of the PVD chamber. According to some embodiments, $SiN_x$ is the first layer to be deposited on the interior component 602 comprising Al/O due to its good adhesion between to Al/O. According to one or more embodiments, the first $SiN_x$ layer 603 has a thickness in a range of 20-50 nm. In some embodiments, the $SiN_x$ layer 603 is formed by physical vapor deposition with an $Ar/N_2$ gas mixture flowing in a range of 5-30 sccm $Ar/N_2$ at a pressure in a range of 1-5 mTorr and a power in a range of 300-1500 W using a pulsed DC or RF (13.56 MHz) source to reactively sputter material from a first silicon target. Next, a $SiO_xN_y$ layer 605 is formed on the $SiN_x$ layer 603. The $SiO_xN_y$ layer 605 provides adhesion between both Mo and Si, which are components of a reflective multilayer stack 606. The $SiO_xN_y$ layer 605 is formed by PVD to a thickness in a range of 5-30 nm using an $Ar/N_2/O_2$ gas mixture flowing in a range of 5-30 sccm at a pressure in a range of 1-5 mTorr using a power in a range of 300-1500 W with a pulsed DC or RF (13.56 MHz) source to reactively sputter material from a second silicon target. As shown in FIG. 5, multiple additional bilayers 607 comprised of the $SiN_x$ layer 603 and $SiO_xN_y$ layer 605, can be formed terminating with $SiN_x$ layer 613 and $SiO_xN_y$ layer 615. The number of bilayers of $SiN_x/SiO_xN_y$ can be varied in a range of from 3 to 10 bilayers depending on roughness of the interior component 602 of a PVD chamber to be coated. The average roughness of an interior component 602 such as a process kit can vary in a range of from 250 Ra to 1200 Ra. The 3-10 bilayers can form a bilayer stack 610 comprised of 3, 4, 5, 6, 7, 8, 9 or 10 $SiN_x/SiO_xN_y$ bilayers. After the 3-10 $SiN_x/SiO_xN_y$ bilayers are formed, a Mo/Si reflector stack 606 is deposited using a PVD process as described above.

In some embodiments, 3-10 of one of the following bilayers are formed: $SiN_x$/Mo bilayers, $SiN_x$/Al bilayers, $SiN_x/MoSi_x$ bilayers, $SiN_x/AlSi_x$ bilayers, $SiN_x/Mo_xAl_y$ bilayers, $SiO_xN_y$/Mo bilayers, $SiO_xN_y$/Al bilayers, $SiO_xN_y/MoSi_x$ bilayers, $SiO_xN_y/AlSi_x$ bilayers, and $SiO_xN_y/Mo_xAl_y$ bilayers. The layer thicknesses can be in the ranges provided above for the first and second layers of the bilayers. After the 3-10 bilayers are formed, a Mo/Si reflector stack 606 is deposited using a PVD process as described above.

Figure 6:
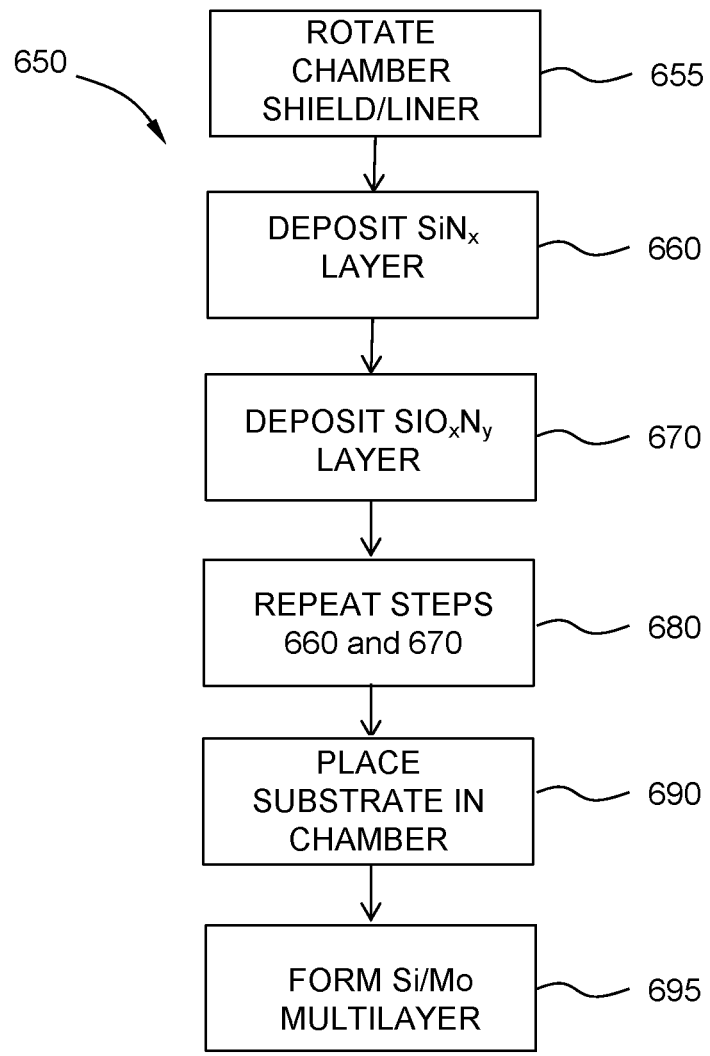
FIG. 6 is a flowchart showing a process according to one or more embodiments.

Referring to FIG. 6, in one or more embodiments, a method 650 of manufacturing an extreme ultraviolet (EUV) mask blank 600 comprises depositing a $SiN_x$ on an interior component of a PVD chamber at 660, and then depositing a $SiO_xN_y$ layer at 670. Then, at 680, step 660 and 670 are repeated 3, 4, 5, 6, 7, 8, 9 or 10 times to form 3, 4, 5, 6, 7, 8, 9 or 10 $SiN_x/SiO_xN_y$ bilayers. In alternative embodiments, the method can form 3, 4, 5, 6, 7, 8, 9 or 10 $SiN_x$/Mo bilayers, $SiN_x$/Al bilayers, $SiN_x/MoSi_x$ bilayers, $SiN_x/AlSi_x$ bilayers, $SiN_x/Mo_xAl_y$ bilayers, $SiO_xN_y$/Mo bilayers, $SiO_xN_y$/Al bilayers, $SiO_xN_y/MoSi_x$ bilayers, $SiO_xN_y/AlSi_x$ bilayers, and $SiO_xN_y/Mo_xAl_y$ bilayers. Then, at 690, a substrate is placed in a multi-cathode (MC) physical vapor deposition (PVD) chamber. The method 650 further includes depositing a multilayer reflector stack at 695, for example a Si/Mo stack by alternately sputtering a third silicon target and a fourth molybdenum target. The method can then be repeated.

According to one or more embodiments, it was determined that rotating the interior components of a PVD chamber, for example process kit components such as the upper shield 306, the middle shield 316, and the lower shield 318 as shown in FIG. 3, which may collectively be provide what is called a chamber "liner," results in improved coverage of the interior components of the PVD chamber. The rotating pedestal 310, which is coupled to a rotating shaft 319a, rotates about axis 322 in the direction of arrow 314 as shown in FIG. 3. The rotating pedestal can be coupled to the liner, e.g., the lower shield 318, which can be coupled to the middle shield 316, which can be coupled to the upper shield 306. In some embodiments, the liner can comprise a single continuous shield or two shield components. Thus, by rotating the liner or at least one shield (e.g., the lower shield 318, the middle shield 316 or the upper shield 306, or all three of the lower shield 318, the middle shield 316 or the upper shield 306) of the PVD chamber 300 during deposition of the $SiN_x/SiO_xN_y$ bilayers, $SiN_x$/Mo bilayers, $SiN_x$/Al bilayers, $SiN_x/MoSi_x$ bilayers, $SiN_x/AlSi_x$ bilayers, $SiN_x/Mo_xAl_y$ bilayers, $SiO_xN_y$/Mo bilayers, $SiO_xN_y$/Al bilayers, $SiO_xN_y/MoSi_x$ bilayers, $SiO_xN_y/AlSi_x$ bilayers, or $SiO_xN_y/Mo_xAl_y$ bilayers provides improved uniformity of the $SiN_x/SiO_xN_y$ bilayers on the shield/liner. In some embodiments, the PVD chamber 300 comprises a rotating adapter 324 which rotates the chamber liner comprised of at least the lower shield 318, and in some embodiments, a single shield or liner extending from the rotating pedestal 310, to the intermediate chamber body 325 provides a uniform $SiN_x/SiO_xN_y$ bilayer. The rotating adapter 324 transfers the rotation motion of rotating pedestal 310 to the chamber liner, in the form of one or more shields. The rotating adapter 324 can be affixed by fasteners such as screws or bolts or otherwise affixed to the rotating pedestal 310 so that when pedestal 310 is rotated about the shaft 312 around axis 322 in the direction of arrow 314, the rotating adapter 324 then rotates, which can than then rotate the liner in the form of one or more shields. In one or more embodiments, the rotating speed of chamber liner can be up to 20 rpm.

In one or more embodiments, a method comprises providing two Si targets in a multi-cathode PVD chamber to form a $SiN_x/SiO_xN_y$ bilayer coating on the interior components, for example the liner or a shield of the PVD chamber. In one or more embodiments, a first Si target is used for $SiN_x$ deposition, and a second Si target is used for $SiO_xN_y$ deposition. The chamber liner (e.g., one or more shields) is rotating during the $SiN_x/SiO_xN_y$ bilayer deposition process to ensure coating uniformity. In some embodiments, rotation speed of the chamber liner or one or more shields is controlled so that there are 3-5 full cycles of rotation for each $SiN_x$ layer and each $SiO_xN_y$ layer deposition.

According to one or more embodiments, a process comprises rotating the chamber liner as shown at 655 in FIG. 6. Then, a $SiN_x$ layer is deposited at 660 by flowing an $Ar/N_2$ gas mixture and setting chamber liner rotating speed to deposit $SiN_x$ over a range of 3-5 cycles of chamber liner rotation. A $SiO_xN_y$ layer is deposited at 670 by flowing an $Ar/N_2/O_2$ gas mixture and setting chamber liner rotating speed to deposit $SiO_xN_y$ over a range of 3-5 cycles of chamber liner rotation. Then, at 680, steps 660 and 670 are repeated 3 to 10 times depending on the roughness of the liner or shield being coated. Then, the chamber liner rotation is stopped, a substrate is placed in the chamber at 690, and a Si/Mo multilayer stack is formed on the substrate at 695.

According to one or more embodiments, coating of $SiN_x/SiO_xN_y$ bilayers, $SiN_x$/Mo bilayers, $SiN_x$/Al bilayers, $SiN_x/MoSi_x$ bilayers, $SiN_x/AlSi_x$ bilayers, $SiN_x/Mo_xAl_y$ bilayers, $SiO_xN_y$/Mo bilayers, $SiO_xN_y$/Al bilayers, $SiO_xN_y/MoSi_x$ bilayers, $SiO_xN_y/AlSi_x$ bilayers, or $SiO_xN_y/Mo_xAl_y$ bilayers exhibits good adhesion to both Al/O and Mo/Si by combining the two components of the bilayers. In some embodiments, rotating the chamber liner or shield(s) during deposition of the bilayers provides for a more uniform coating on the interior components of the PVD chamber such as the process kit components. In one or more embodiments, the bilayer covers loosened Al/O on interior components of the PVD chamber such as process kits, and hence reduces defects of Al/O to near or equal to zero. Mo/Si deposition is also adhesive to the bilayer, and hence defects of Mo/Si flakes are also largely reduced. In some embodiments, a yield of zero defects during deposition of a multilayer stack of Mo/Si during EUV mask blank production increased from 10% of production runs having zero defects when no bilayer was used to greater than 50% of production runs exhibiting zero defects by applying the bilayer to the interior components of the PVD chamber prior to deposition of the Si/Mo multilayer stack.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of manufacturing an extreme ultraviolet (EUV) mask blank, the method comprising:
depositing a first layer on a portion of a chamber interior of a multi-cathode physical vapor deposition (PVD) chamber;
depositing a second layer on the first layer to form a bilayer selected from the group consisting of a $SiN_x$/$SiO_xN_y$ bilayer, a $SiN_x$/Mo bilayer, a $SiN_x$/Al bilayer, a $SiN_x$/$MoSi_x$ bilayer, a $SiN_x$/$AlSi_x$ bilayer, a $SiN_x$/$Mo_xAl_y$ bilayer, a $SiO_xN_y$/Mo bilayer, a $SiO_xN_y$/Al bilayer, a $SiO_xN_y$/$MoSi_x$ bilayer, a $SiO_xN_y$/$AlSi_x$ bilayer, and a $SiO_xN_y$/$Mo_xAl_y$ bilayer;
forming a range of from 3 to 10 bilayers of the first layer and the second layer;
placing a substrate in the multi-cathode physical vapor deposition (PVD) chamber after forming the range of from 3 to 10 bilayers; and
forming a multilayer stack of alternating layers of molybdenum and silicon on the substrate.

2. The method of claim 1, wherein the first layer is a $SiN_x$ layer, the second layer is a $SiO_xN_y$ layer, and the multi-cathode PVD chamber comprises a first silicon target, a second silicon target, a third silicon target and a fourth molybdenum target.

3. The method of claim 2, further comprising flowing a mixture of Ar/$N_2$ gas in the PVD chamber and sputtering from the first silicon target to form the $SiN_x$ layer on the portion of the chamber interior.

4. The method of claim 3, further comprising flowing a mixture of Ar/$N_2$/$O_2$ gas in the PVD chamber and sputtering the second silicon target to form the $SiO_xN_y$ layer on the $SiN_x$ layer to form a $SiN_x$/$SiO_xN_y$ bilayer.

5. The method of claim 1, wherein the bilayers comprise $SiN_x$/$SiO_xN_y$.

6. The method of claim 1, wherein the portion of the chamber interior comprises a liner.

7. The method of claim 6, wherein the liner comprises a shield.

8. The method of claim 6, further comprising rotating the liner while forming each of the $SiN_x$ layer and the $SiO_xN_y$ layer.

9. The method of claim 8, wherein the liner is not rotated during formation of the multilayer stack of alternating layers of molybdenum and silicon on the substrate.

10. A method of manufacturing an extreme ultraviolet (EUV) mask blank, the method comprising:
rotating a liner of a multi-cathode physical vapor deposition (PVD) chamber;
depositing a first layer on the liner while the liner is rotating;
depositing a second layer on the first layer while the liner is rotating to form a bilayer selected from the group consisting of a $SiN_x$/$SiO_xN_y$ bilayer, a $SiN_x$/Mo bilayer, a $SiN_x$/Al bilayer, a $SiN_x$/$MoSi_x$ bilayer, a $SiN_x$/$AlSi_x$ bilayer, a $SiN_x$/$Mo_xAl_y$ bilayer, a $SiO_xN_y$/Mo bilayer, a $SiO_xN_y$/Al bilayer, a $SiO_xN_y$/$MoSi_x$ bilayer, a $SiO_xN_y$/$AlSi_x$ bilayer, and a $SiO_xN_y$/$Mo_xAl_y$ bilayer;
stopping rotation of the liner;
placing a substrate in the multi-cathode physical vapor deposition (PVD) chamber including a chamber interior; and
forming a multilayer stack of alternating layers of molybdenum and silicon on the substrate.

11. The method of claim 10, wherein the first layer is a $SiN_x$ layer, the second layer is a $SiO_xN_y$ layer, and the multi-cathode PVD chamber comprises a first silicon target, a second silicon target, a third silicon target and a fourth molybdenum target.

12. The method of claim 11, further comprising flowing a mixture of Ar/$N_2$ gas in the PVD chamber and sputtering from the first silicon target to form the $SiN_x$ layer on the liner.

13. The method of claim 12, further comprising flowing a mixture of Ar/$N_2$/$O_2$ gas in the PVD chamber and sputtering the second silicon target to form the $SiO_xN_y$ layer on the $SiN_x$ layer to form a $SiN_x$/$SiO_xN_y$ bilayer.

14. The method of claim 13, further comprising forming a range of from 3 to 10 $SiN_x$/$SiO_xN_y$ bilayers before placing the substrate in the multi-cathode PVD chamber.

15. The method of claim 11, wherein the liner is rotated so that deposition of each of the $SiO_xN_y$ layer and the $SiN_x$ layer occurs during 3 to 5 full cycles of liner rotation.

16. The method of claim 15, further comprising controlling rotation speed of the liner to a speed of 20 rpm or less.

17. A multi-cathode physical vapor deposition (PVD) chamber comprising:
a first silicon target, a second silicon target, a third silicon target and a molybdenum target;
a liner lining an interior of the PVD chamber, the liner configured to rotate; and
a controller configured to perform the method according to claim 10.

18. The multi-cathode physical vapor deposition (PVD) chamber of claim 17, wherein the controller is configured to form 3 to 8 bilayers.

19. The multi-cathode physical vapor deposition (PVD) chamber of claim 17, wherein the controller is configured to stop rotation of the liner prior to loading of a substrate into the chamber.

20. The multi-cathode physical vapor deposition (PVD) chamber of claim 19, wherein the controller is configured to form a multilayer stack of alternating layers of molybdenum and silicon on the substrate by alternately sputtering the third silicon target and the molybdenum target.

* * * * *